US012733174B2

(12) United States Patent
Zhu

(10) Patent No.: US 12,733,174 B2
(45) Date of Patent: Sep. 8, 2026

(54) NOR-TYPE MEMORY DEVICE, METHOD OF MANUFACTURING NOR-TYPE MEMORY DEVICE, AND ELECTRONIC APPARATUS INCLUDING MEMORY DEVICE

(71) Applicant: Institute of Microelectronics, Chinese Academy of Sciences, Beijing (CN)

(72) Inventor: Huilong Zhu, Poughkeepsie, NY (US)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 697 days.

(21) Appl. No.: 18/176,002

(22) Filed: Feb. 28, 2023

(65) Prior Publication Data

US 2024/0008283 A1 Jan. 4, 2024

(30) Foreign Application Priority Data

Jul. 1, 2022 (CN) ......................... 202210777207.4
Jul. 19, 2022 (CN) ........................ 202210849985.X

(51) Int. Cl.
*H10B 51/20* (2023.01)
*G11C 11/22* (2006.01)
(Continued)

(52) U.S. Cl.
CPC ............ *H10B 51/20* (2023.02); *G11C 11/223* (2013.01); *G11C 11/2259* (2013.01);
(Continued)

(58) Field of Classification Search
CPC ........ H10B 51/20; H10B 43/27; H10B 43/35; H10B 51/30; H10B 43/50; H10B 51/50;
(Continued)

(56) References Cited

U.S. PATENT DOCUMENTS 11,081,524 B2 8/2021 Hua et al.
11,502,128 B2 11/2022 Wu et al.
(Continued)

FOREIGN PATENT DOCUMENTS

CN 112909010 A 6/2021
CN 113707666 A 11/2021
(Continued)

OTHER PUBLICATIONS

"Chinese Application No. 202210849985.X, Office Action dated Jul. 3, 2025", w English Translation, (Jul. 3, 2025), 10 pgs.
(Continued)

*Primary Examiner* — Yasser A Abdelaziez
(74) *Attorney, Agent, or Firm* — Schwegman Lundberg & Woessner, P.A.

(57) ABSTRACT

Disclosed are a NOR-type memory device, a method of manufacturing the NOR-type memory device, and an electronic apparatus. The NOR-type memory device includes: at least one memory cell layer including a first source/drain layer, a first channel layer, a second source/drain layer, a second channel layer, and a third source/drain layer that are stacked on each other; at least one gate stack that extends vertically and includes a gate conductor layer and a memory functional layer between the gate conductor layer and the at least one memory cell layer. A memory cell is defined at an intersection of the gate stack and the memory cell layer. At least one bit line is electrically connected to the second source/drain layer in the memory cell layer; and at least one source line is electrically connected to the first and third source/drain layers in the memory cell layer.

15 Claims, 11 Drawing Sheets

(51) Int. Cl.

| | |
|---|---|
| ***G11C 16/04*** | (2006.01) |
| ***G11C 16/06*** | (2006.01) |
| ***H10B 43/27*** | (2023.01) |
| ***H10B 43/35*** | (2023.01) |
| ***H10B 51/30*** | (2023.01) |

(52) U.S. Cl.
CPC .......... *G11C 16/0466* (2013.01); *G11C 16/06* (2013.01); *H10B 43/27* (2023.02); *H10B 43/35* (2023.02); *H10B 51/30* (2023.02)

(58) Field of Classification Search
CPC .............. G11C 11/223; G11C 11/2259; G11C 16/0466; G11C 16/06; G11C 16/0416
See application file for complete search history.

(56) References Cited

U.S. PATENT DOCUMENTS

| | | | | |
|---|---|---|---|---|
| 2015/0124530 | A1* | 5/2015 | Jung .................. | G11C 16/0483 257/314 |
| 2019/0319044 | A1* | 10/2019 | Harari ................ | G11C 16/0466 |
| 2020/0098779 | A1* | 3/2020 | Cernea .................. | H10B 43/50 |
| 2020/0194416 | A1* | 6/2020 | Or-Bach ................ | H10B 41/27 |
| 2020/0286958 | A1 | 9/2020 | Hua et al. | |
| 2021/0050360 | A1 | 2/2021 | Kai et al. | |
| 2021/0242241 | A1* | 8/2021 | Rajashekhar .......... | H10B 41/10 |
| 2021/0399052 | A1 | 12/2021 | Wu et al. | |
| 2022/0384525 | A1 | 12/2022 | Wu et al. | |
| 2022/0392919 | A1 | 12/2022 | Wang et al. | |

FOREIGN PATENT DOCUMENTS

| | | |
|---|---|---|
| CN | 113707667 A | 11/2021 |
| TW | 202034509 | 9/2020 |
| TW | 202145539 | 12/2021 |
| TW | 202201742 | 1/2022 |

OTHER PUBLICATIONS

"Taiwanese Application Serial No. 112104579, Office Action dated Nov. 7, 2023", w English Translation, (Nov. 7, 2023), 14 pgs.
"Chinese Application No. 202210849985.X, Office Action dated Feb. 7, 2026", w English Translation, Feb. 7, 2026, 16 pgs.

* cited by examiner

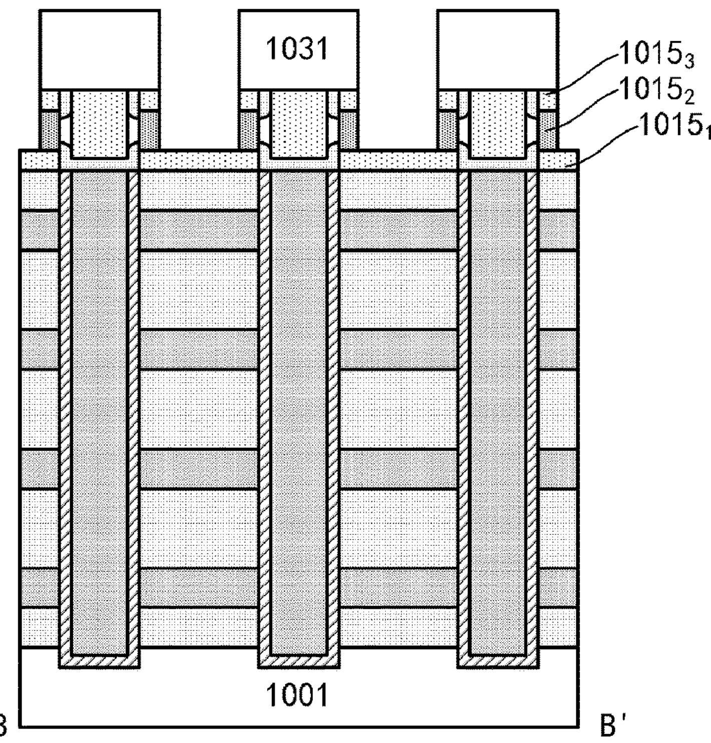
FIG. 6(c)
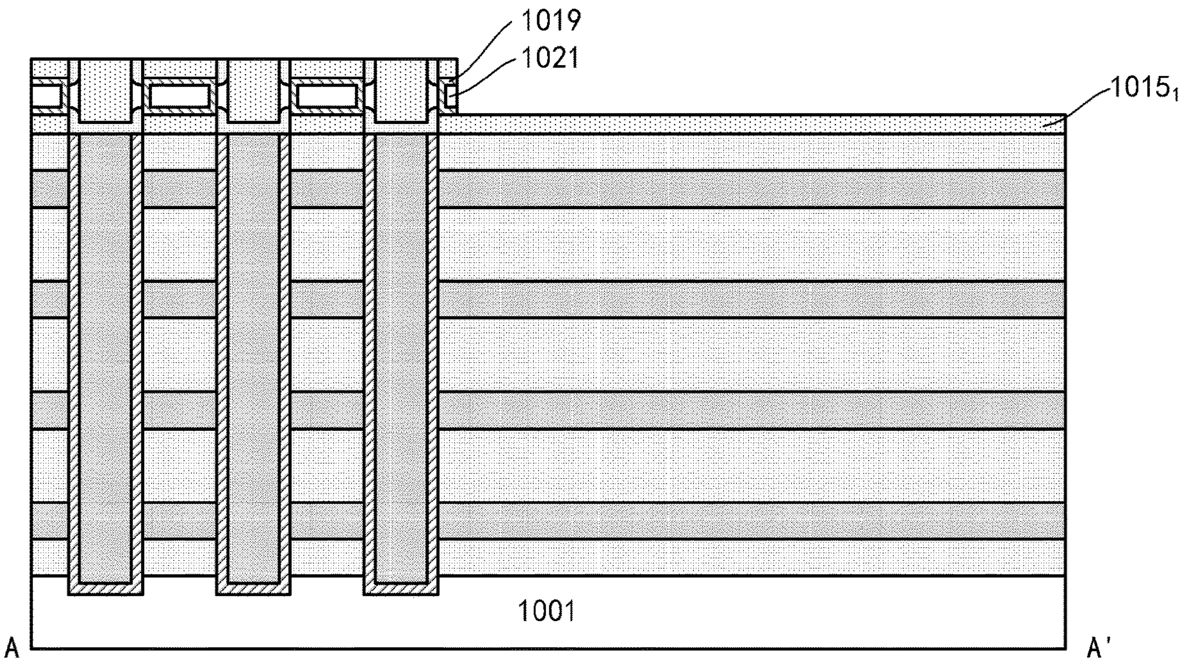
FGI. 7(a)

NOR-TYPE MEMORY DEVICE, METHOD OF MANUFACTURING NOR-TYPE MEMORY DEVICE, AND ELECTRONIC APPARATUS INCLUDING MEMORY DEVICE

CROSS-REFERENCE TO RELATED APPLICATIONS

This application is claims priority to Chinese Application No. 202210777207.4 filed on Jul. 1, 2022, and Chinese Application No. 202210849985.X filed on Jul. 19, 2022 which are incorporated herein by reference in their entirety.

TECHNICAL FIELD

The present disclosure relates to the field of semiconductors, and more particularly, to a NOR-type memory device, a method of manufacturing the NOR-type memory device, and an electronic apparatus including the memory device.

BACKGROUND

In a planar device such as a Metal Oxide Semiconductor Field Effect Transistor (MOSFET), a source, a gate and a drain are arranged in a direction substantially parallel to a substrate surface. Due to such an arrangement, the planar device is difficult to be further scaled down. In contrast, in a vertical device, a source, a gate and a drain are arranged in a direction substantially perpendicular to a substrate surface. As a result, the vertical device is easier to be scaled down compared to the planar device.

Vertical devices may be stacked to increase an integration density. However, this may lead to poor performance. Because in order to stack a plurality of devices conveniently, polycrystalline silicon is usually used as a channel material, resulting in a greater resistance compared with using monocrystalline silicon as the channel material. In addition, it is desired to further increase the integration density and improve the performance.

SUMMARY

In view of the above, the present disclosure aims to provide, among others, a NOR-type memory device with an improved integration density, an improved performance, an improved reliability, and an optimized manufacturing process, a method of manufacturing the NOR-type memory device, and an electronic apparatus including the memory device.

According to an aspect of the present disclosure, there is provided a NOR-type memory device, including: at least one memory cell layer disposed on a substrate, wherein the at least one memory cell layer includes a first source/drain layer, a first channel layer, a second source/drain layer, a second channel layer, and a third source/drain layer that are stacked on each other; at least one gate stack that extends vertically with respect to the substrate to pass through the at least one memory cell layer, wherein the at least one gate stack includes a gate conductor layer and a memory functional layer disposed between the gate conductor layer and the at least one memory cell layer, and a memory cell is defined at an intersection of the at least one gate stack and the at least one memory cell layer; at least one bit line electrically connected to the second source/drain layer in the at least one memory cell layer; and at least one source line electrically connected to the first source/drain layer and the third source/drain layer in the at least one memory cell layer.

According to another aspect of the present disclosure, there is provided a NOR-type memory device, including: at least one memory cell layer disposed on a substrate, wherein the at least one memory cell layer includes an active region configured to define a memory cell; at least one gate stack that extends vertically with respect to the substrate to pass through the at least one memory cell layer, wherein the at least one gate stack includes a gate conductor layer and a memory functional layer disposed between the gate conductor layer and the at least one memory cell layer; and at least one select transistor disposed above the at least one gate stack, wherein the at least one select transistor includes an active layer on the at least one gate stack and a select gate stack surrounding a periphery of the active layer.

According to another aspect of the present disclosure, there is provided a method of manufacturing a NOR-type memory device, including: disposing at least one memory cell layer on a substrate, wherein the at least one memory cell layer includes a first source/drain layer, a first channel layer, a second source/drain layer, a second channel layer, and a third source/drain layer that are stacked on each other; forming at least one gate hole that extends vertically with respect to the substrate to pass through the at least one memory cell layer; forming a corresponding gate stack in the at least one gate hole, wherein the gate stack includes a gate conductor layer and a memory functional layer disposed between the gate conductor layer and the at least one memory cell layer, and a memory cell is defined at an intersection of the gate stack and the at least one memory cell layer; forming at least one bit line, wherein the at least one bit line is electrically connected to the second source/drain layer in the at least one memory cell layer; and forming at least one source line, wherein the at least one source line is electrically connected to the first source/drain layer and the third source/drain layer in the at least one memory cell layer.

According to another aspect of the present disclosure, there is provided a method of manufacturing a NOR-type memory device, including: disposing at least one memory cell layer on a substrate, wherein the at least one memory cell layer includes an active region configured to define a memory cell; forming at least one gate hole that extends vertically with respect to the substrate to pass through the at least one memory cell layer; forming a corresponding gate stack in the at least one gate hole, wherein the gate stack includes a gate conductor layer and a memory functional layer disposed between the gate conductor layer and the at least one memory cell layer, and the memory cell is defined at an intersection of the gate stack and the at least one memory cell layer; etching back the gate stack; forming, in the at least one gate hole, an active layer for a select transistor in a space formed by etching back the gate stack; and forming, outside the at least one gate hole, a select gate stack surrounding a periphery of the active layer for the select transistor.

According to another aspect of the present disclosure, there is provided an electronic apparatus including the NOR-type memory device described above.

According to embodiments of the present disclosure, a stack of single crystal material may be used as a building block to build a three-dimensional (3D) NOR-type memory device. Therefore, when a plurality of memory cell layers are stacked, an increase of resistance may be suppressed. Between each of the memory cell layers, especially between bit lines (BL) adjacent in a vertical direction, there is no need to provide an additional isolation layer, which may optimize the process and facilitate the increase of integration.

BRIEF DESCRIPTION OF THE DRAWINGS

The above and other objects, features, and advantages of the present disclosure will become more apparent from following descriptions on embodiments thereof with reference to attached drawings, in which:

FIGS. 1, 2(*b*), 3 to 5, 6(*b*), 7(*a*), 8(*a*), 9, 10, and 11(*b*) are cross-sectional views taken along line AA';

FIGS. 6(*c*), 7(*b*), and 8(*b*) are cross-sectional views taken along line BB'.

Throughout the drawings, the same or similar reference numbers denote the same or similar elements.

DETAILED DESCRIPTION OF EMBODIMENTS

Figure 1:
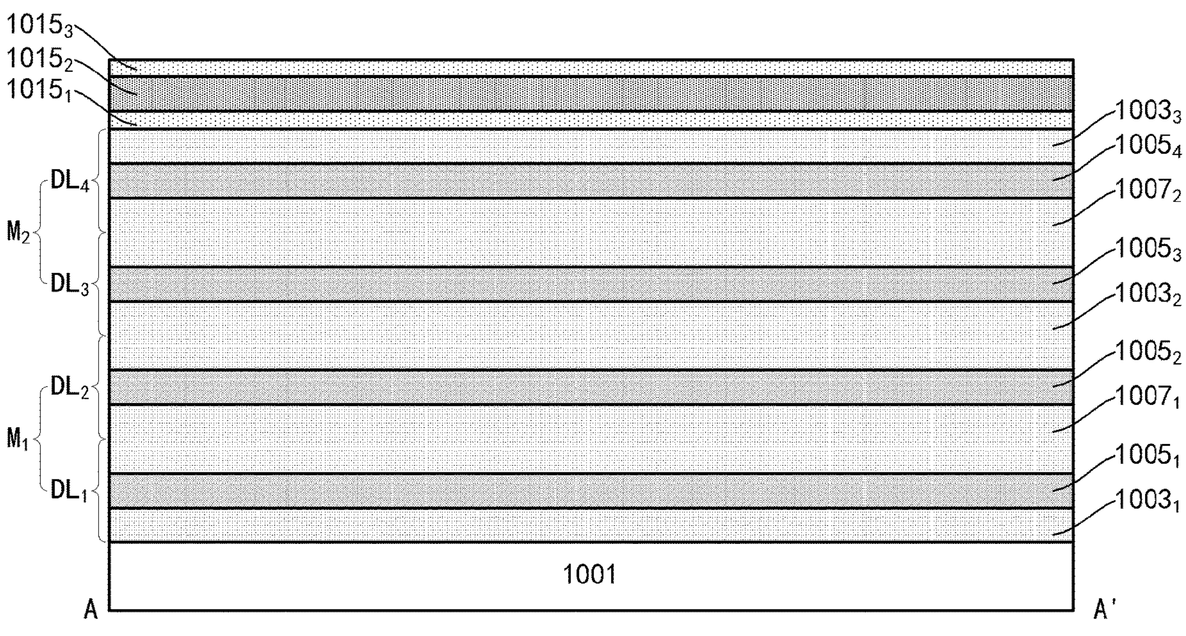
FIGS. 1 to 12 are schematic diagrams showing some stages in a process of manufacturing a NOR-type memory device according to an embodiment of the present disclosure.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structures according to the embodiments are schematically shown. However, they are not drawn to scale, and some features may be enlarged while some features may be omitted for sake of clarity. Moreover, shapes and relative sizes and positions of regions and layers shown in the drawings are also illustrative, and deviations may occur due to manufacture tolerances and technique limitations in practice. Those skilled in the art may also devise regions/layers of other different shapes, sizes, and relative positions as desired in practice.

In the context of the present disclosure, when a layer/element is recited as being "on" a further layer/element, the layer/element may be disposed directly on the further layer/element, or otherwise there may be an intervening layer/element interposed therebetween. Further, if a layer/element is "on" a further layer/element in an orientation, then the layer/element may be "under" the further layer/element when the orientation is turned.

A memory device according to an embodiment of the present disclosure is based on a vertical device. The vertical device may include an active region arranged on a substrate in a vertical direction (a direction substantially perpendicular to a surface of the substrate). The active region includes source/drain regions at upper and lower ends of the active region and a channel region between the source/drain regions. A conductive channel may be formed between the source/drain regions through the channel region. In the active region, the source/drain regions and the channel region may be defined by, for example, a doping concentration.

According to an embodiment of the present disclosure, the active region may be defined by a stack of a lower source/drain layer, a channel layer, and an upper source/drain layer on the substrate. The source/drain regions may be formed in the lower source/drain layer and the upper source/drain layer respectively, and the channel region may be formed in the channel layer. A gate stack may extend through the stack, so that the active region may surround a periphery of the gate stack. Here, the gate stack may include a memory functional layer, such as at least one of a charge trapping material or a ferroelectric material, so as to achieve a memory function. In this way, the gate stack is cooperated with the active region opposite to the gate stack, so as to define a memory cell (or a cell composition device used to form the memory cell). Here, the memory cell may be a flash memory cell.

According to an embodiment of the present disclosure, adapting to an arrangement of a bit line (BL) and a source line (SL), a single memory cell may be defined based on two cell composition devices connected in parallel. For this purpose, a stack of a first source/drain layer, a first channel layer, a second source/drain layer, a second channel layer, and a third source/drain layer may be arranged. Accordingly, a gate stack passing through the stack may be opposite to the first source/drain layer, the first channel layer, and the second source/drain layer, so as to define a first cell composition device. In addition, the gate stack passing through the stack may be opposite to the second source/drain layer, the second channel layer, and the third source/drain layer, so as to define a second cell composition device. Such two cell composition devices may be electrically connected to the same BL (in parallel) through the common second source/drain layer. In addition, such two cell composition devices may be electrically connected to the same word line (WL) (through the gate stack). Accordingly, the first cell composition device and the second cell composition device (defining the single memory cell) may be addressed through the same BL and the same WL.

In a NOR (NOT OR)-type memory device, the memory cell may be electrically connected between the BL and the SL. When the second source/drain layer in the stack is electrically connected to the BL, the first source/drain layer and the third source/drain layer may be electrically connected to the SL.

A plurality of gate stacks may be arranged to pass through the stack, so as to define a plurality of memory cells at intersections of the plurality of gate stacks and the stack. In a plane where the stack is located, these memory cells are arranged into an array (for example, generally, a two-dimensional array arranged in rows and columns) corresponding to the plurality of gate stacks.

Since the vertical device is easy to be stacked, the memory device according to an embodiment of the present disclosure may be a three-dimensional (3D) array. Specifically, a plurality of such stacks may be arranged in the vertical direction. The gate stack may extend vertically, so as to pass through the plurality of stacks. In this way, for a single gate stack, it intersects the plurality of stacks stacked in the vertical direction to define a plurality of memory cells stacked in the vertical direction.

Such stacks may be formed by epitaxial growth on the substrate and may be of single crystal semiconductor material. Various layers in the stack may be doped in situ respectively during the growth, and there may be a doping concentration interface between different doped layers. In this way, a doping distribution in the vertical direction may be better controlled. The stack of the lower source/drain layer, the channel layer, and the upper source/drain layer may form a bulk material, and thus the channel region is formed in the bulk material. In this case, the process is relatively simple.

In a conventional process, an isolation layer needs to be arranged between (at least) some stacks to electrically isolate BLs adjacent to each other. A relatively complex process is required to form an arrangement in which (a semiconductor, especially a single crystal semiconductor) stack and the isolation layer are stacked on each other. According to an embodiment of the present disclosure, respective stacks may be in direct contact with each other. For example, for a lower stack and an upper stack located above the lower stack, the uppermost source/drain layer (i.e., the third source/drain layer) of the lower stack and the lowermost source/drain layer (i.e., the first source/drain layer) of the upper stack may be the same layer, and/or the lowermost source/drain layer (i.e., the first source/drain layer) of the upper stack and the uppermost source/drain layer (i.e., the third source/drain layer) of the lower stack may be the same layer. It is relatively easy to form a plurality of (semiconductor, especially single crystal semiconductor) stacks stacked on each other. Moreover, although there is the isolation layer between adjacent BLs, mutual interference may exist between the adjacent BLs. In contrast, according to an embodiment of the present disclosure, each BL is separated from another BL by at least one SL and a cell composition device electrically connected to the SL, so the mutual interference between different BLs may be effectively suppressed and reliability may be improved.

In addition, although compared with the conventional process in which the memory cell is based on a single cell composition device, the memory cell according to the embodiment of the present disclosure is based on more (that is, two) cell composition devices and thus has a larger size (for example, has a larger height), an integration density of the memory cell according to the embodiment of the present disclosure may also be improved because the isolation layer may be omitted and the manufacturing process, especially the process of forming the stack as above, is optimized.

According to an embodiment of the present disclosure, on each gate stack a corresponding select transistor may be disposed in order to reduce the number of interconnections. As described below, the select transistor may be self-aligned to the corresponding gate stack.

Such vertical memory device may be manufactured as follows. Specifically, a plurality of memory cell layers may be disposed on the substrate. Each of the plurality of memory cell layers includes e.g. the stack of the first source/drain layer, the first channel layer, the second source/drain layer, the second channel layer, and the third source/drain layer. For example, these layers may be provided by epitaxial growth. A thickness of each layer, especially a thickness of the channel layer, may be controlled during epitaxial growth. In addition, in situ doping may be performed during epitaxial growth, so as to achieve a desired doping polarity and doping concentration. Here, each layer in the stack may include the same material. In this case, the so-called “layers” may be defined by a doping concentration interface between them.

A gate hole, which extends vertically with respect to the substrate to pass through the stack in each memory cell layer, may be formed. The gate stack may be formed in the gate hole, and the select transistor may be fabricated on the gate stack.

The present disclosure may be presented in various forms, and some examples of which will be described below. In the following description, the selection of various materials is involved. In selecting the materials, etching selectivity is considered in addition to the function of the materials (for example, a semiconductor material is used to form the active region, a dielectric material is used to form an electrical isolation, and a conductive material is used to form an electrode, an interconnection structure, etc.). In the following description, the required etching selectivity may or may not be indicated. It should be clear to those skilled in the art that when etching a certain material layer is mentioned below, if it is not mentioned that other layers are also etched or the drawing does not show that other layers are also etched, then this etching may be selective, and the material layer may have etching selectivity with respect to other layers exposed to the same etching recipe.

FIGS. 1 to 12 are schematic diagrams showing some stages in a process of manufacturing a NOR-type memory device according to an embodiment of the present disclosure.

As shown in FIG. 1, a substrate 1001 is provided. The substrate 1001 may be a substrate in any form, for example, but not limited to, a bulk semiconductor material substrate such as a bulk silicon (Si) substrate, a Semiconductor On Insulator (SOI) substrate, a compound semiconductor substrate such as an SiGe substrate, or the like. Hereinafter, the bulk Si substrate, such as a Si wafer, will be described by way of example for the convenience of description.

On the substrate 1001, a memory device, such as a NOR-type flash memory, may be formed as described below. A memory cell in the memory device may include an n-type cell composition device or a p-type cell composition device. Here, the n-type cell composition device is described as an example. For this purpose, a p-type well may be formed in the substrate 1001. Therefore, the following description, in particular the description of a doping type, is for forming the n-type cell composition device. However, the present disclosure is not limited thereto.

On the substrate 1001, source/drain layers $\mathbf{1003}_1$, $\mathbf{1007}_1$, $\mathbf{1003}_2$, $\mathbf{1007}_2$, and $\mathbf{1003}_3$ and channel layers $\mathbf{1005}_1$, $\mathbf{1005}_2$, $\mathbf{1005}_3$, and $\mathbf{1005}_4$ may be formed alternately by, for example, epitaxial growth, so that each of the channel layers $\mathbf{1005}_1$, $\mathbf{1005}_2$, $\mathbf{1005}_3$, and $\mathbf{1005}_4$ may have source/drain layers adjacent to the each of the channel layers on upper and lower sides of the each of the channel layers respectively. Accordingly, each of the channel layers $\mathbf{1005}_1$, $\mathbf{1005}_2$, $\mathbf{1005}_3$, and $\mathbf{1005}_4$ along with the upper and lower adjacent source/drain layers may define respective one of device layers $DL_1$, $DL_2$, $DL_3$, and $DL_4$. (An array of) cell composition devices may be formed in each device layer, and active regions of such cell composition devices may be defined by corresponding device layers. Adjacent device layers may share a common source/drain layer (and thus are electrically connected to each other). In FIG. 1, the common source/drain layer is shown that an upper portion of the common source/drain layer belongs to an upper device layer while a lower portion of the common source/drain layer belongs to a lower device layer, which is just a diagram for easy understanding, but not necessarily having a physical boundary or interface.

In an example of FIG. 1, the four device layers $DL_1$, $DL_2$, $DL_3$, and $DL_4$ corresponding to the four channel layers $\mathbf{1005}_1$, $\mathbf{1005}_2$, $\mathbf{1005}_3$, and $\mathbf{1005}_4$ are shown, but the present disclosure is not limited thereto. For example, there may be more (or less) channel layers, and thus there may be more (or less) device layers.

FIG. 1 further shows memory cell layers M1 and M2. As further described below, in an embodiment of the present disclosure, a memory cell is defined by a pair of cell composition devices (which are connected in parallel and)

adjacent to each other in the vertical direction, and the pair of cell composition devices are respectively formed in a pair of adjacent device layers. Accordingly, each of the memory cell layers M1 and M2 may correspond to a respective pair of device layers, and an array of memory cells may be formed in each memory cell layer (corresponding to an array of cell composition devices in the corresponding pair of device layers).

Here, different reference numbers $\mathbf{1003}_n$ (n=1, 2, 3 in the example of FIG. 1; and n may be larger in a case of more device layers), and $\mathbf{1007}_m$ (m=1, 2 in the example of FIG. 1; and m may be larger in the case of more device layers) may be used for source/drain layers on an upper side and a lower side of the same channel layer, partly because they may be electrically connected differently in subsequence (for example, they may be connected to SL and BL respectively; and in the following, a source/drain layer denoted by $\mathbf{1003}_n$ may be connected to SL, while a source/drain layer denoted by $\mathbf{1007}_m$ may be connected to BL). However, it does not mean that the source/drain layers on the upper and lower sides of the same channel layer must have different characteristics (for example, geometric characteristics such as thickness, material characteristics such as composition, doping characteristics such as doped elements and concentration, etc.; of course, it is possible that they are different in at least one aspect).

One or more (or even all) of these source/drain layers and channel layers formed on the substrate 1001, especially the channel layer, may be a single crystal semiconductor layer. These layers may have a crystal interface or a doping concentration interface between each other because they are grown or doped separately.

Each of the source/drain layers $\mathbf{1003}_1$, $\mathbf{1007}_1$, $\mathbf{1003}_2$, $\mathbf{1007}_2$, and $\mathbf{1003}_3$ may define a source/drain region of the cell composition device, and may have a thickness of, for example, about 20 nm to 150 nm. For example, the source/drain layers $\mathbf{1003}_1$, $\mathbf{1007}_1$, $\mathbf{1003}_2$, $\mathbf{1007}_2$, and $\mathbf{1003}_3$ may form the source/drain regions by doping (e.g. by in situ doping during growth). For the n-type cell composition device, n-type doping may be performed by using As or P, and the doping concentration may be about 5E18 $cm^{-3}$ to 1E21 $cm^{-3}$, for example.

Each of the channel layers $\mathbf{1005}_1$, $\mathbf{1005}_2$, $\mathbf{1005}_3$, and $\mathbf{1005}_4$ may define a channel region of the cell composition device. A thickness of each of the channel layers $\mathbf{1005}_1$, $\mathbf{1005}_2$, $\mathbf{1005}_3$, and $\mathbf{1005}_4$ may define a gate length of the cell composition device, for example, about 40 nm to 300 nm. The channel layers $\mathbf{1005}_1$, $\mathbf{1005}_2$, $\mathbf{1005}_3$, and $\mathbf{1005}_4$ may not be intentionally doped, or may be lightly doped by in situ doping during growth, so as to improve a short channel effect (SCE), adjust a threshold voltage ($V_t$) of the device, and the like. For example, for the n-type cell composition device, p-type doping may be performed by using B and the like, and the doping concentration is about 1E17 $cm^{-3}$ to 2E19 $cm^{-3}$. In addition, in order to optimize the device performance, the doping concentration in the channel layer may have a non-uniform distribution in the vertical direction, e.g. have a higher doping concentration in a part of the channel region close to a drain region (connected to BL) to improve the SCE, while a lower doping concentration in a part of the channel region close to a source region (connected to SL) to reduce the channel resistance.

These semiconductor layers may include various suitable semiconductor materials, for example, an element semiconductor material such as Si or Ge, a compound semiconductor material such as SiGe, etc. In the example where the substrate 1001 is the silicon wafer, the source/drain layer and the channel layer may include a silicon-based material (in this example, both the source/drain layer and the channel layer are Si). However, the present disclosure is not limited thereto.

A hard mask layer may be provided on such semiconductor layers formed on the substrate 1001, to facilitate patterning. In this example, in order to facilitate the subsequent formation of the select transistor, the hard mask layer may include a stack configuration, e.g. including a first sub-layer $\mathbf{1015}_1$, a second sub-layer $\mathbf{1015}_2$, and a third sub-layer $\mathbf{1015}_3$. The first sub-layer $\mathbf{1015}_1$ and the third sub-layer $\mathbf{1015}_3$ may be solid phase dopant sources, so as to facilitate subsequent doping of the select transistor. Considering the etching selectivity in the subsequent process, the first sub-layer $\mathbf{1015}_1$ and the third sub-layer $\mathbf{1015}_3$ may include oxide (for example, silicon oxide), which contain a dopant such as P to be used as the solid phase dopant source, while the second sub-layer $\mathbf{1015}_2$ may include nitride (for example, silicon nitride). A thickness of each sub-layer is, for example, about 50 nm to 200 nm.

In the device layers $DL_1$, $DL_2$, $DL_3$, and $DL_4$ formed as described above, cell composition devices may be fabricated, so as to form memory cells.

Figure 2A:
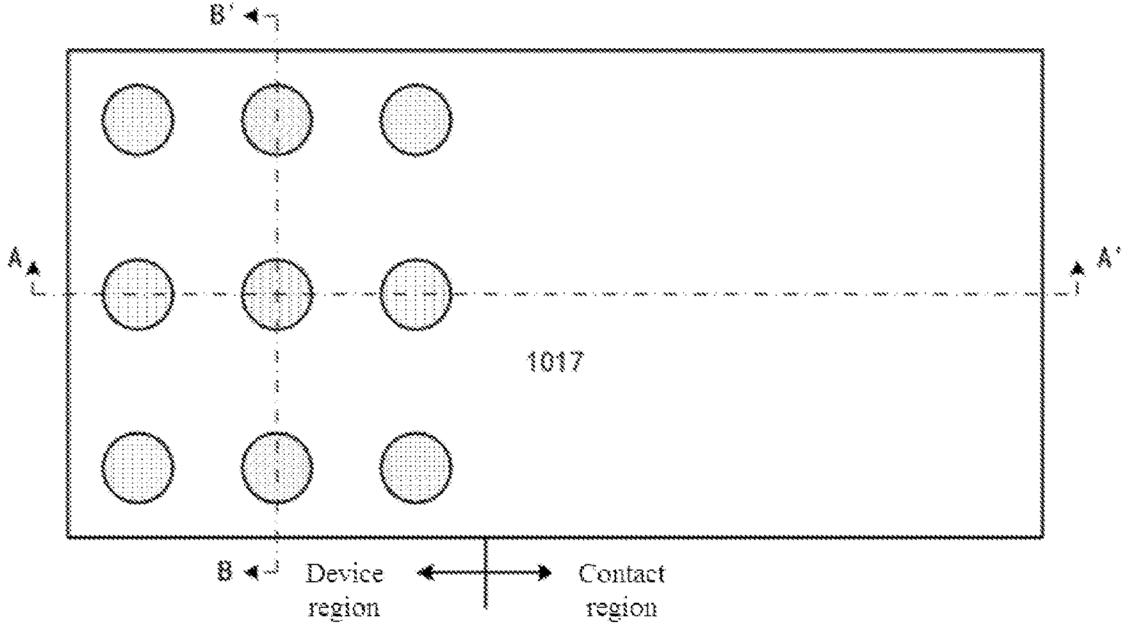
Figure 2B:
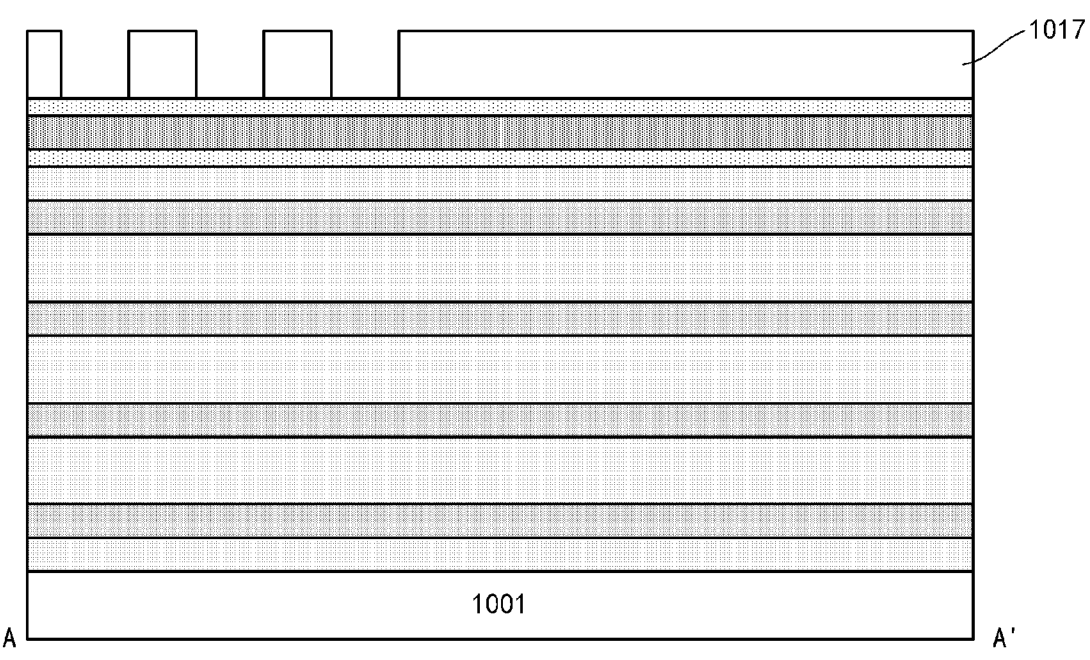

For example, as shown in FIGS. 2(*a*) and 2(*b*), a photoresist 1017 may be formed on the hard mask layer 1015. The photoresist 1017 may be patterned to have a plurality of openings (in a device region on the substrate) by photolithography, and these openings may define positions of gate holes in which the gate stacks are to be formed. The opening may have various suitable shapes, such as round, rectangular, square, polygon, etc. and has a suitable size, such as a diameter or side length of about 20 nm to 500 nm. Here, these openings may be arranged in an array form, such as a two-dimensional array along horizontal and vertical directions in paper in FIG. 2(*a*). The array may then define an array of cell composition devices (and thus an array of memory cells). According to an embodiment of the present disclosure, these openings may have different arrangements, sizes, and shapes from each other.

Figure 3:
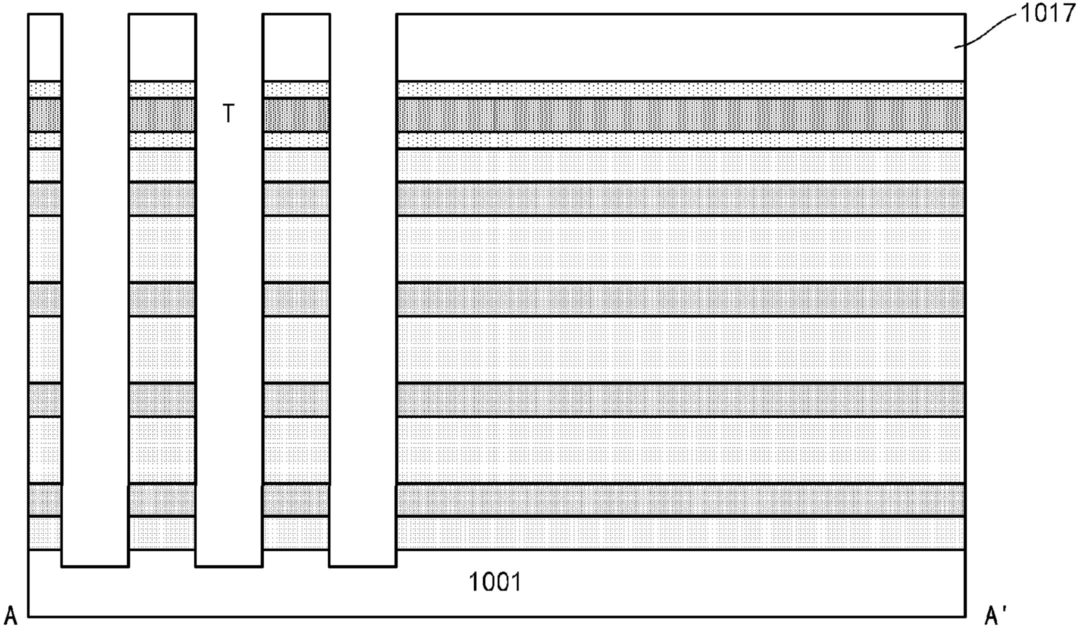

As shown in FIG. 3, the patterned photoresist 1017 may be used as an etching mask to etch each layer on the substrate 1001 by anisotropic etching, such as reactive ion etching (RIE), so as to form a gate hole T. RIE may be performed in a substantially vertical direction (for example, a direction perpendicular to the substrate surface) and may be performed into the substrate 1001. Accordingly, a plurality of vertical gate holes T are left on the substrate 1001. Then, the photoresist 1017 may be removed.

The gate stack may be formed in the gate hole T. Here, a memory function may be achieved by the gate stack. For example, the gate stack may include a memory structure, such as a charge trapping layer or a ferroelectric material.

Figure 4:
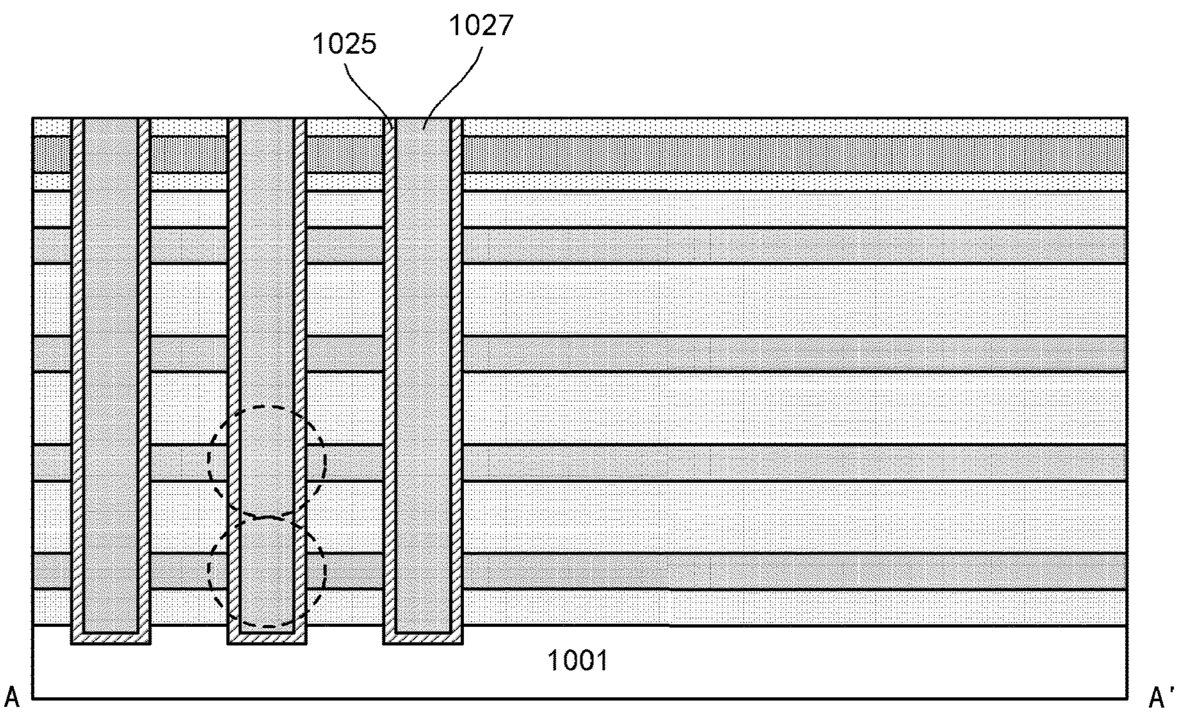

As shown in FIG. 4, a memory functional layer 1025 and a gate conductor layer 1027 may be formed sequentially by, for example, deposition. The memory functional layer 1025 may be formed in a substantially conformal manner. A gap left after the memory functional layer 1025 is formed in the gate hole T may be filled with the gate conductor layer 1027. A planarization treatment, such as chemical mechanical polishing (CMP, for example, CMP may be stopped at the hard mask layer 1015), may be performed on the formed gate conductor layer 1027 and the formed memory function layer 1025, so that the gate conductor layer 1027 and the memory functional layer 1025 may be left in the gate hole T to form the gate stack.

The memory functional layer 1025 may be based on a dielectric charge trapping, a ferroelectric material effect or a bandgap engineering charge memory (SONOS), etc. For example, the memory functional layer 1025 may include a dielectric tunneling layer (such as an oxide with a thickness of about 1 nm to 5 nm, which may be formed by oxidation or ALD), an energy band offset layer (such as a nitride with a thickness of about 2 nm to 10 nm, which may be formed by CVD or ALD), and an isolation layer (such as an oxide with a thickness of about 2 nm to 6 nm, which may be formed by oxidation, CVD or ALD). Such three-layer structure may lead to an energy band structure that traps electrons or holes. Alternatively, the memory functional layer 1025 may include a ferroelectric material layer, such as $HfZrO_2$ with a thickness of about 2 nm to 20 nm.

The gate conductor layer 1027 may include, for example, (doped, such as p-doped in the case of the n-type cell composition device) polysilicon or a metal gate material.

As shown in FIG. 4, the gate stack (1025/1027) having the memory functional layer is surrounded by the active region. The gate stack is cooperated with the active region (the stack of the source/drain layer, the channel layer, and the source/drain layer) to define the cell composition device, as shown in a dotted circle in FIG. 4. The channel region formed in the channel layer may be connected to source/drain regions formed in source/drain layers at opposite ends of the channel region, and the channel region may be controlled by the gate stack. FIG. 4 shows a pair of cell composition devices adjacent to each other in the vertical direction with two dotted lines. As described below, the pair of cell composition devices then define a single memory cell.

The gate stack extends in a column shape in the vertical direction and intersects with a plurality of device layers, so as to define a plurality of cell composition devices (and thus, a plurality of memory cells) stacked on each other in the vertical direction. Memory cells associated with a single gate stack column may form a memory cell string. Corresponding to an arrangement (corresponding to the above arrangement of the gate hole T, such as the two-dimensional array) of the gate stack columns, a plurality of such memory cell strings are arranged on the substrate, so as to form a three-dimensional (3D) array of memory cells.

In addition, select transistors may be formed above each memory cell string respectively.

Figure 5:
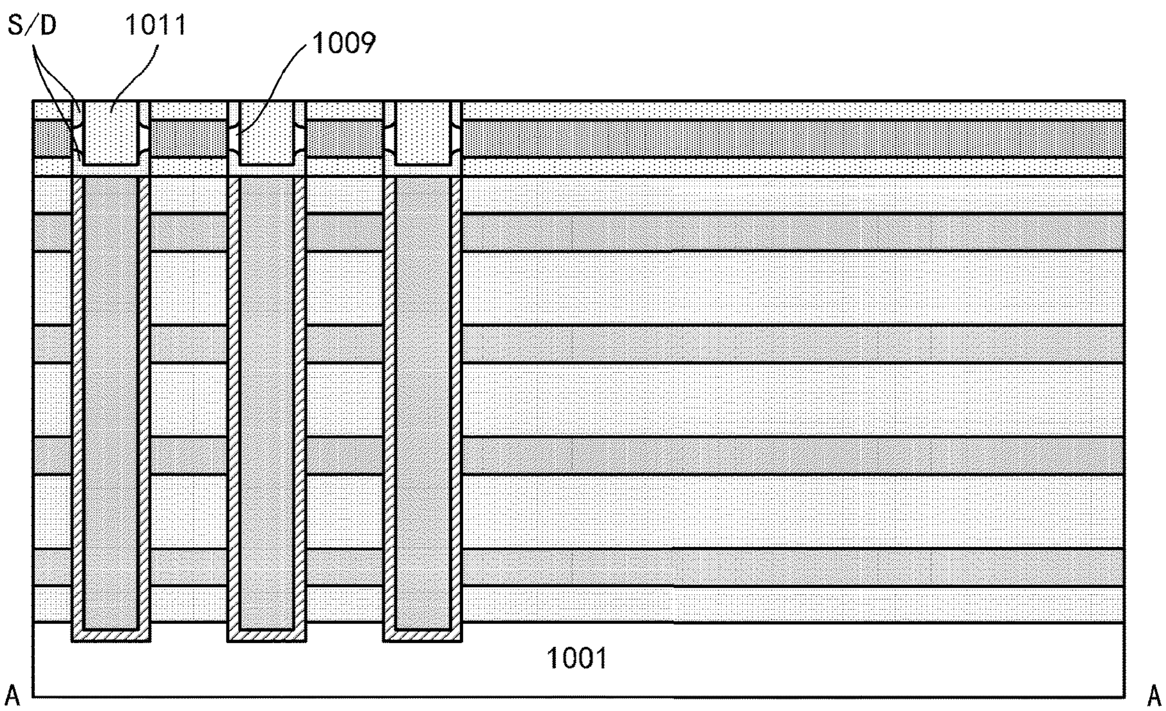

For example, as shown in FIG. 5, the gate stack (1025/1027) may be etched back/recessed to a certain height by selective etching such as RIE. A height of a top surface of the gate stack after back etching/recess may cause (at least a part of) the first sub-layer $\mathbf{1015}_1$ of the hard mask layer exposed on a sidewall of the gate hole T, while the top source/drain layer $\mathbf{1003}_3$ may not be exposed on the sidewall of the gate hole T and is still covered by the gate stack. For example, the height of the top surface of the gate stack after back etching/recess may be between a top surface and a bottom surface of the first sub-layer $\mathbf{1015}_1$ of the hard mask layer. In a space released due to the back etching/recess of the gate stack in the gate hole T, an active layer 1009 may be formed by deposition in a substantially conformal manner. Accordingly, the active layer 1009 may have a cup shape, including a bottom portion extending on the top surface of the gate stack and a side portion extending on the sidewall of the gate hole T (a portion of the active layer 1009 outside the gate hole T will be removed by the subsequent process).

The active layer 1009 may include a semiconductor material such as (polycrystalline) Si to define an active region of the select transistor, and a thickness of the active layer 1009 is about 5 nm to 20 nm, for example. The dopant may be driven from the first sub-layer $\mathbf{1015}_1$ and the third sub-layer $\mathbf{1015}_3$ that act as the solid phase dopant sources into the active layer 1009 by annealing, for example, a peak annealing or rapid heat processing (RTP) of about 0.5 seconds to 2 seconds at about 700° C. to 1050° C., so as to form a source/drain region S/D of the select transistor in regions in the active layer 1009 which correspond to the first sub-layer $\mathbf{1015}_1$ and the third sub-layer $\mathbf{1015}_3$. Here, a condition of an annealing process may be controlled so that the dopant diffused from the solid phase dopant sources will not substantially affect the middle portion (a region corresponding to the second sub-layer $\mathbf{1015}_2$) of the active layer 1009 in the vertical direction.

In addition, in order to reduce the contact resistance, a bottom portion of the active layer 1009 may be doped (the doping type is the same as the source/drain S/D, and the doping concentration is about 1E19 $cm^{-3}$ to 1E21 $cm^3$, for example) by an ion implantation in the vertical direction. According to an embodiment of the present disclosure, the ion implantation may be performed before the above-mentioned annealing process, so that the implanted dopant may be activated by the above-mentioned annealing process without hannealing separately for the ion implantation.

Accordingly, the active region of the select transistor is defined above each string of memory cells. The active region of the select transistor may include source/drain regions formed at upper and lower ends of the active layer 1009 (in the vertical direction) and a channel region between the source/drain regions (in the middle of the vertical direction). The source/drain region at the lower end of the select transistor is electrically connected to the gate conductor layer 1027 of the memory cell (through a highly doped region at the bottom portion of the active layer 1009).

In a gap obtained after forming the active layer 1009 in the gate hole T, a filling portion 1011 may be formed by depositing a dielectric material such as oxide followed by the planarization treatment such as CMP (the portion of the active layer 1009 outside the gate hole T may be removed in this planarization treatment).

A gate stack of the select transistor may be fabricated by a self-aligning process. For example, the second sub-layer $\mathbf{1015}_2$ in the hard mask may be replaced by the gate stack of the select transistor, so that the resulted gate stack may be self-aligned to a channel region of the select transistor.

Currently, the hard mask layer extends continuously around each gate hole. It is desired to expose the second sub-layer $\mathbf{1015}_2$ so as to replace the second sub-layer $\mathbf{1015}_2$. In addition, considering the formation of a select line described below, the hard mask layer may be patterned into a series of lines that extend substantially in parallel.

Figure 6A:
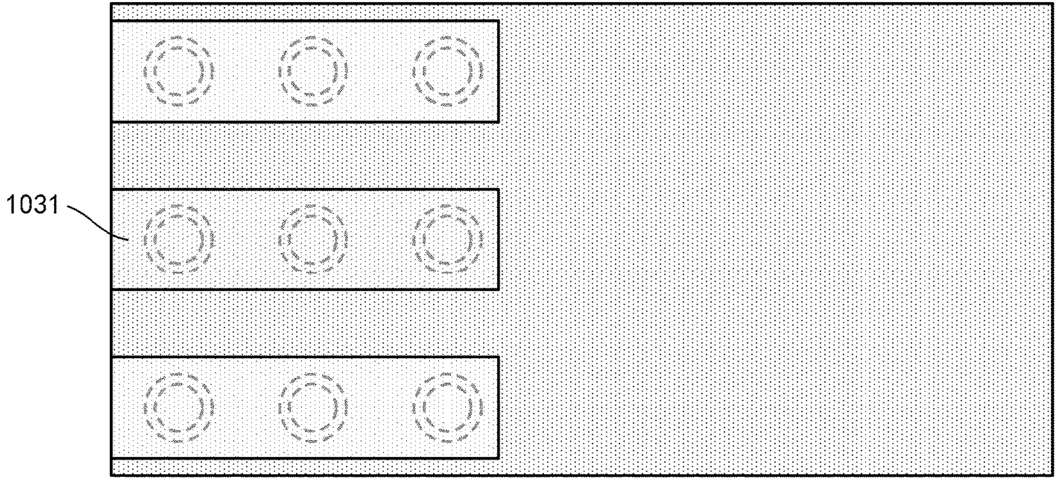
Figure 6B:
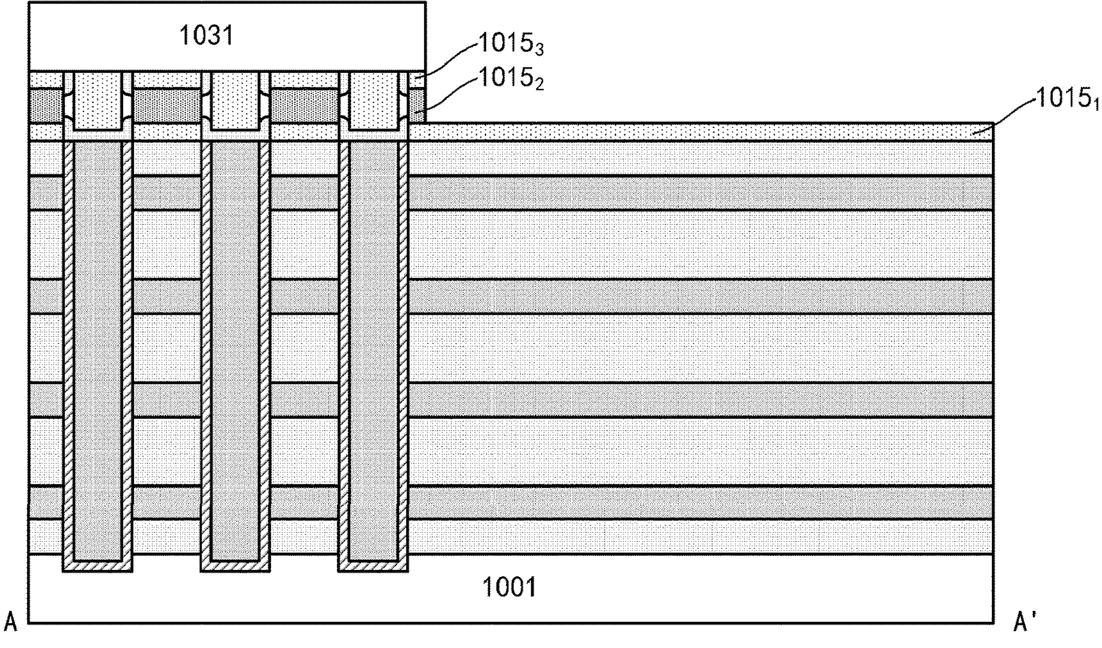

For example, as shown in FIGS. 6(*a*), 6(*b*), and 6(*c*), a photoresist 1031 may be formed on the hard mask layer, and the photoresist 1031 is patterned into a plurality of linear patterns extending along a first direction (for example, a horizontal direction in paper of FIG. 6(*a*)) by photolithography. Such linear patterns are spaced from each other in a second direction (for example, a vertical direction in paper of FIG. 6(*a*)) that intersects (for example, perpendicular to) the first direction, (so as to cover a row of gate holes in the first direction respectively). The third sub-layer $\mathbf{1015}_3$ and the second sub-layer $\mathbf{1015}_2$ of the hard mask layer may be etched successively through selectively etching such as RIE, by using the photoresist 1031 as an etching mask. Here, etching may be stopped at the first sub-layer $\mathbf{1015}_1$, so as to protect a device layer below the first sub-layer $\mathbf{1015}_1$ when the gate stack of the select transistor is subsequently formed. In this way, as shown in FIG. 6(*a*), the third sub-layer $\mathbf{1015}_3$ and the second sub-layer $\mathbf{1015}_2$ in the hard mask layer are formed into strips extending in the first direction, surrounding a periphery of (the active layer 1009 formed in) the corresponding row of gate holes, and a sidewall of the second sub-layer $\mathbf{1015}_2$ is exposed. Then, the photoresist 1031 may be removed.

Figure 7B:
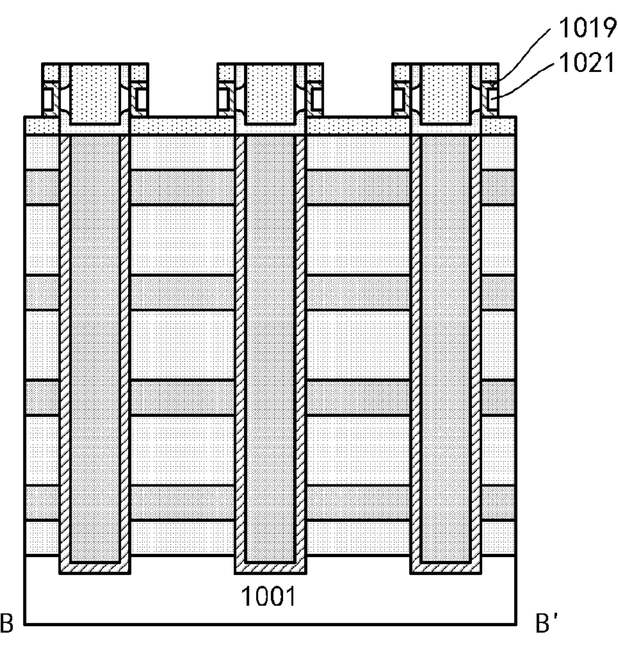
Figure 8A:
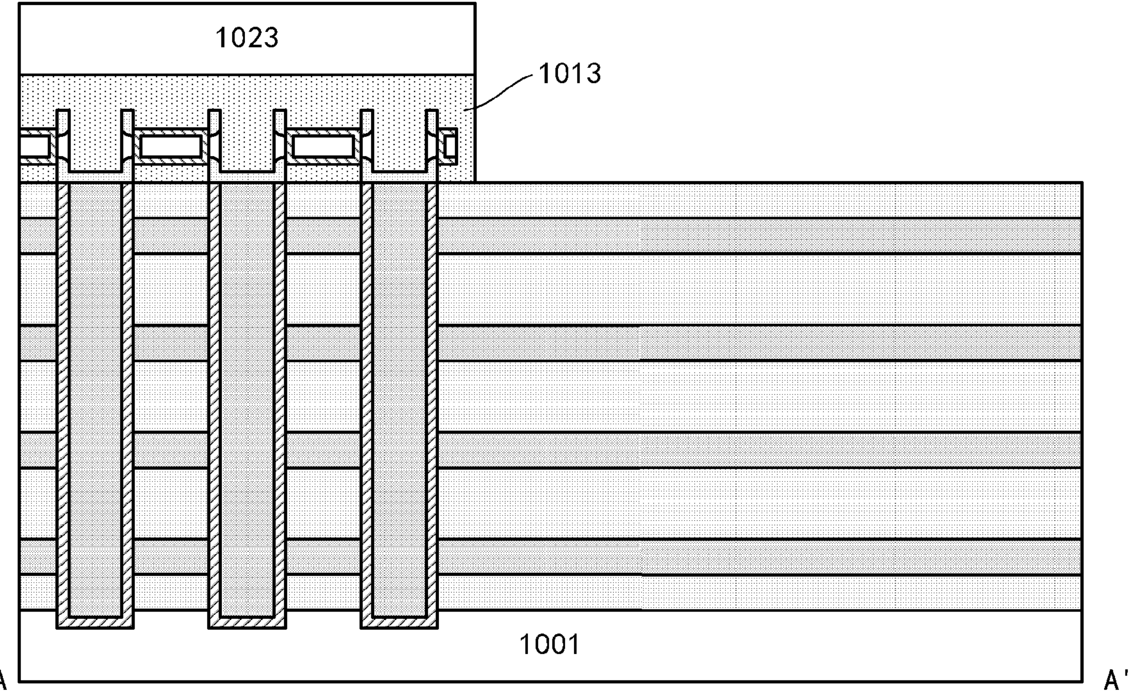
Figure 8B:
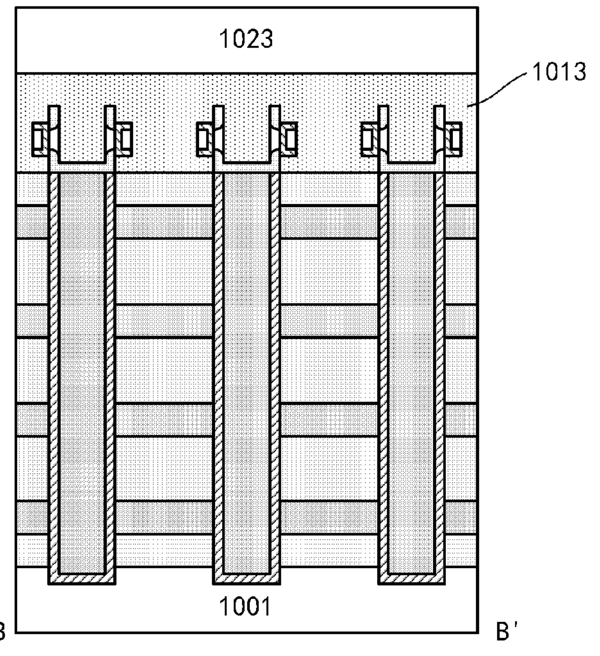

As shown in FIGS. 7(*a*) and 7(*b*), the second sub-layer $\mathbf{1015}_2$ may be removed by selective etching, such as wet etching with hot phosphoric acid, and the gate stack of the select transistor may be formed in a gap left between the first sub-layer $\mathbf{1015}_1$ and the third sub-layer $\mathbf{1015}_3$ due to the removal of the second sub-layer $\mathbf{1015}_2$. For example, a gate dielectric layer 1019 and a gate metal layer 1021 may be deposited successively, and the deposited gate dielectric layer 1019 and the gate metal layer 1021 may be etched by using the third sub-layer $\mathbf{1015}_3$ as a mask. Accordingly, the gate stack (1019/1021) may be formed into a strip corresponding to a pattern of the photoresist 1031 (and a select line may be formed accordingly), and may surround the periphery of the active layer 1019 formed in the corresponding row of gate holes. According to an embodiment, the gate dielectric layer 1019 may include a high k dielectric such as $HfO_2$, and a thickness of the gate dielectric layer 1019 is about 1 nm to 10 nm. The gate metal layer 1021 may include a work function adjustment layer such as TiN and a conductive metal layer such as Al or W. An oxide interface layer with a thickness of about 0.5 nm to 2 nm, for example, may further be formed between the gate dielectric layer 1019 and the active layer by oxidation or deposition.

So far, the fabrication of the memory cell (string) and the select transistor is substantially completed. Then, various electrical contact portions may be fabricated to achieve a desired electrical connection.

In order to achieve an electrical connection to each device layer, a step structure may be formed in the contact region on the substrate. Such step structure may be formed in various manners in the art. According to an embodiment of the present disclosure, the step structure may be formed as follows, for example.

As shown in FIGS. 7(*a*) and 7(*b*), a top end of the active layer 1009 of the select transistor is exposed on a surface of the hard mask layer. In order to protect the active layer 1009 when fabricating the step structure, another hard mask layer may be formed on the hard mask layer first. In this example, the another hard mask layer may include oxide like the first sub-layer $\mathbf{1015}_1$, the third sub-layer $\mathbf{1015}_3$, and the filling portion 1011. Accordingly, the another hard mask layer, the first sub-layer $\mathbf{1015}_1$, the third sub-layer $\mathbf{1015}_3$ and the filling section 1011 are shown as integral in FIGS. 8(*a*) and 8(*b*), and are denoted by 1013. A photoresist 1023 may be formed on the hard mask layer 1013, and the photoresist 1023 is patterned by photolithography to shield the device region and expose the contact region. The hard mask layer 1013 may be etched to expose the device layer (here, the top source/drain layer $\mathbf{1003}_3$) through selectively etching such as RIE, by using the photoresist 1023 as an etching mask. After that, the photoresist 1023 may be removed.

Figure 9:
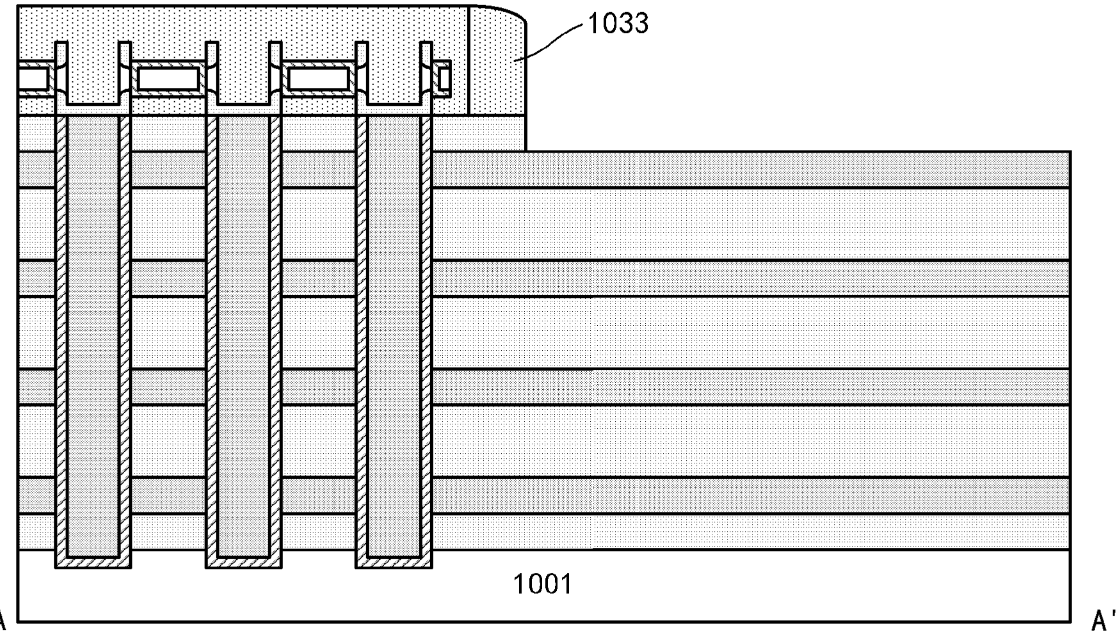

As shown in FIG. 9, a spacer 1033 may be formed on sidewalls of the hard mask layer 1013 through a spacer formation process. For example, a layer of dielectric such as oxide may be deposited in a substantially conformal manner, and then anisotropic etching such as RIE in the vertical direction may be performed on the deposited dielectric, so as to remove a transverse extending portion of the deposited dielectric and retain a vertical extending portion of the deposited dielectric, thereby forming the spacer 1033. Here, considering that the hard mask layer 1013 also includes oxide, an etching depth of the RIE may be controlled to be substantially equal to or slightly greater than a deposition thickness of the dielectric, so as to avoid exposing the action layer 1009. A width of the spacer 1033 (in the horizontal direction in FIG. 9) may be substantially equal to the deposition thickness of the dielectric. The width of the spacer 1033 defines a size of a landing pad of a contact portion to the source/drain layer $\mathbf{1003}_3$ in the device layer $DL_4$.

Selective etching such as RIE may be performed on the exposed source/drain layer $\mathbf{1003}_3$ by using the formed spacer 1033 as an etching mask, so as to expose the channel layer $\mathbf{1005}_4$ in the device layer $DL_4$. The etching may be stopped at an upper portion of the channel layer $\mathbf{1005}_4$ by controlling an etching depth. In this way, a step is formed between the source/drain layer $\mathbf{1003}_3$ and a surface of the channel layer $\mathbf{1005}_4$ exposed by the spacer 1033 in the contact region.

Figure 10:
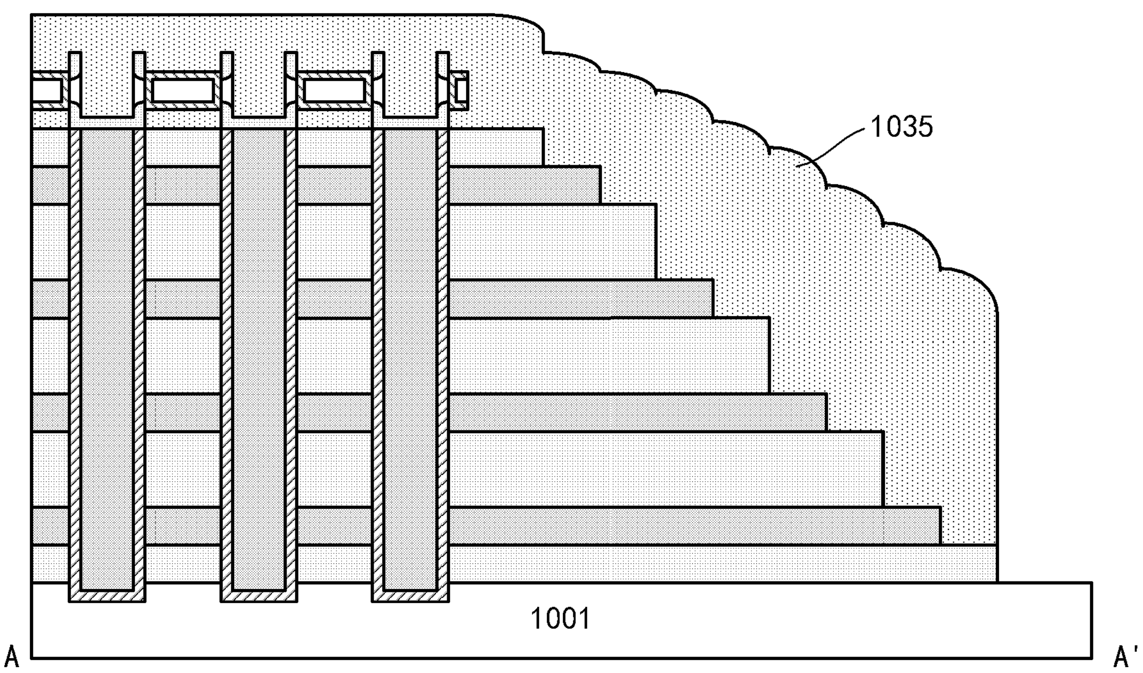

According to the process described above in combination with FIG. 9, the spacer is formed and etching is performed by taking the spacer as the etching mask. Accordingly, a plurality of steps may be formed in the contact region, as shown in FIG. 10. Such steps form such a step structure that in each device layer, each of the layers to be electrically connected, e.g. the above described source/drain layer and optional channel layer, has an end portion protruded with respect to the upper layer, so as to define a landing pad of a contact portion to the layer. A portion of each formed spacer being left after processing is denoted by 1035 in FIG. 10. Since both the spacer 1035 and the hard mask layer are oxide, they are shown here as integral. Here, a portion of the substrate 1001 is also exposed by the step structure, so as to subsequently fabricate a contact portion to the substrate.

Next, the contact portion may be fabricated.

Figure 11A:
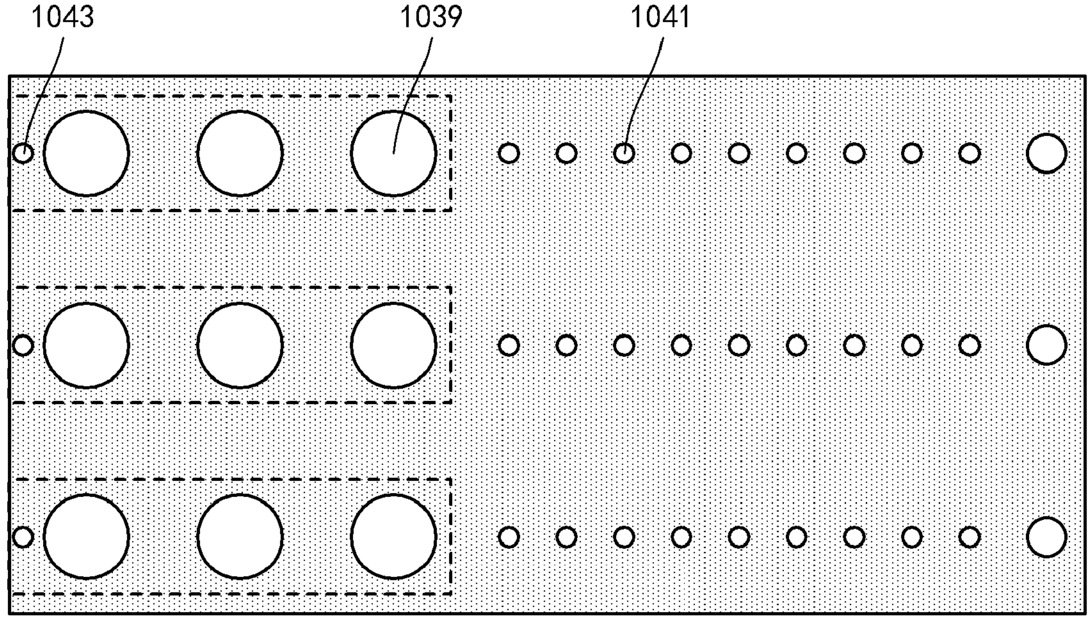
Figure 11B:
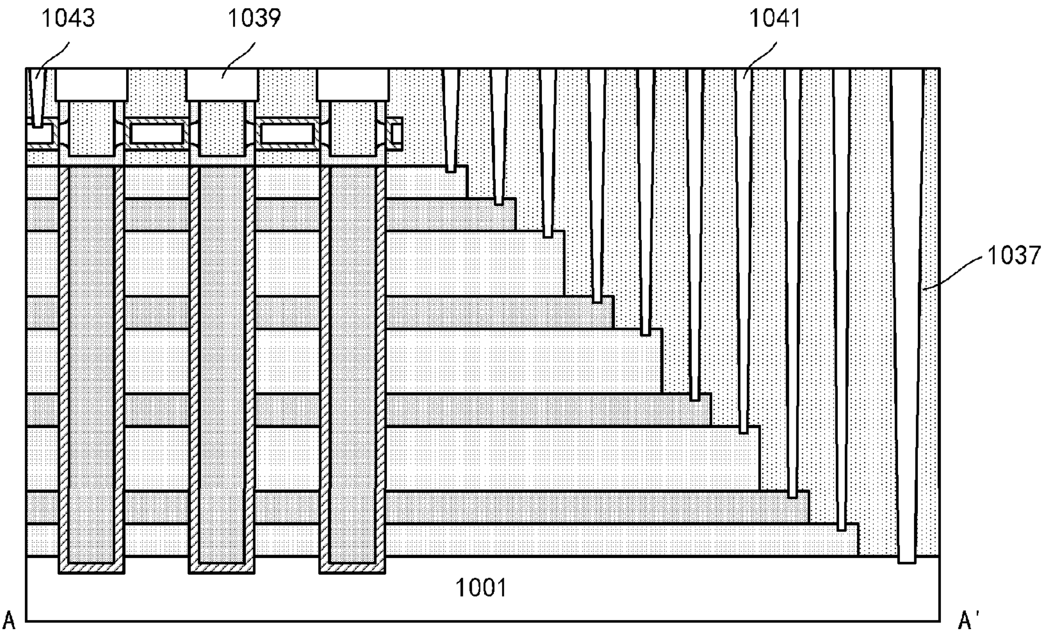

For example, as shown in FIGS. 11(*a*) and 11(*b*), an interlayer dielectric layer 1037 may be formed by depositing oxide and planarization such as CMP Here, since the previously formed spacer 1035 and the interlayer dielectric layer 1037 are oxides, they are shown as integral. Contact portions 1039, 1041, and 1043 may be formed in the interlayer dielectric layer 1037. Specifically, the contact portion 1039 is formed in the device region, electrically connected to the select transistor, and electrically connected to the gate conductor layer 1027 of the cell composition device via the select transistor. The contact portion 1041 is formed in the contact region and electrically connected to each source/drain layer (and optionally channel layer). The contact portion 1043 is formed in the device region and electrically connected to the gate conductor layer 1021 (or a corresponding select line) of the select transistor. Such contact portions may be formed by etching the interlayer dielectric layer 1037 to obtain holes and filling the holes with a conductive material such as a metal.

Here, the contact portion 1039 may be electrically connected to the WL. Through WL, a gate control signal may be applied to the gate conductor layer 1027 of the cell composition device via the contact portion 1039 (and then via the select transistor). The gate control signal may be applied to the gate conductor layer 1021 of the select transistor via the contact portion 1043, so as to control the applying of a signal from WL to the gate conductor layer 1027 of the cell composition device.

In the contact portion 1041, a contact portion contacting the source/drain layer $\mathbf{1003}_n$ may be electrically connected to the SL, while a contact portion contacting the source/drain layer $\mathbf{1007}_m$ may be electrically connected to the BL. Two device layers adjacent to each other in the vertical direction may share the same source/drain layer (for example, device layers DL1 and DL2 may share the source/drain layer $\mathbf{1007}_1$, device layers DL2 and DL3 may share the source/drain layer $1003_2$, and device layers DL3 and DL4 may share the source/drain layer $1007_2$). The common source/drain layer may be electrically connected to SL or BL, while a further source/drain layer in each device layer may be electrically connected to BL or SL. In this way, the NOR-type configuration may be obtained. The adjacent device layers (for example, DL1 and DL2, DL3 and DL4), in which the common source/drain layer (for example, $1007_1$, $1007_2$) is electrically connected to BL, may form a memory cell layer (M1, M2). In the same memory cell layer, a pair of adjacent cell composition devices defined by different device layers (combined with the gate stack) may define a memory cell.

Here, a contact portion to the channel layer is further formed. Such contact portion may be called a bulk contact portion and may receive a bulk bias, so as to adjust a threshold voltage of the device. In addition, a contact portion to (a well region in) the substrate 1001 may be provided.

Figure 12:
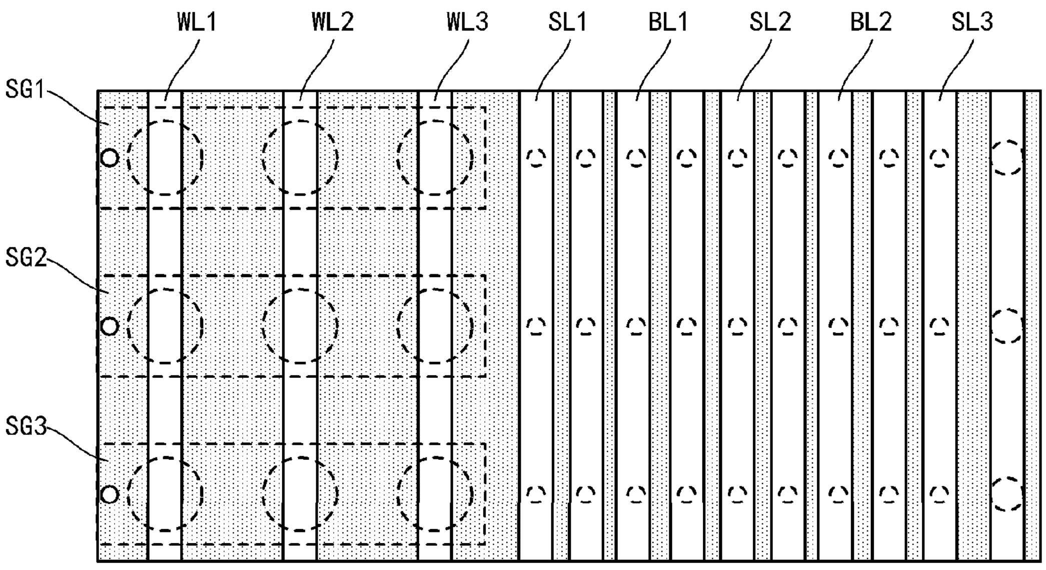

FIG. 12 schematically shows an arrangement of word lines WL1, WL2, and WL3, bit lines BL1 and BL2, source lines SL1, SL2, and SL3, and select lines SG1, SG2, and SG3.

The word lines WL1, WL2, and WL3 may be extended along the second direction to be electrically connected to a column of contact portions 1039 in the second direction respectively (and thus the word lines WL1, WL2, and WL3 are electrically connected to a corresponding column of select transistors, and further electrically connected to the gate conductor layer 1027 in a corresponding column of gate holes). The bit lines BL1 and BL2 may be extended along the second direction to be electrically connected to source/drain layers $1007_2$ and $1007_1$, respectively. The source lines SL1, SL2, and SL3 may be extended along the second direction to be electrically connected to the source/drain layers $1003_3$, $1003_2$, and $1003_1$, respectively. The select lines SG1, SG2 and SG3 may be extended along the first direction to surround respective select transistors and serve as gate electrodes of the select transistors. FIG. 12 also shows a bulk connection which is respectively arranged between each source line and each line and electrically connected to each channel layer.

Figure 13:
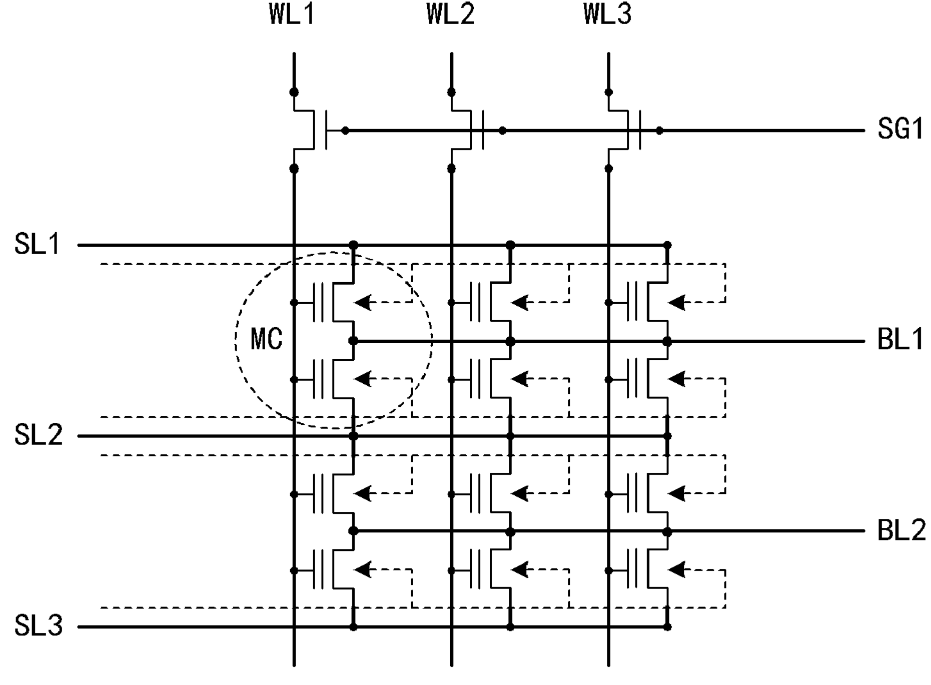
FIG. 13 schematically shows an equivalent circuit diagram of a NOR-type memory device according to an embodiment of the present disclosure.

FIG. 13 schematically shows an equivalent circuit diagram of a NOR-type memory device according to an embodiment of the present disclosure.

In an example of FIG. 13, three word lines WL1, WL2, and WL3 and two bit lines BL1 and BL2 are schematically shown. However, specific numbers of bit lines and word lines are not limited thereto. A memory cell MC is provided at an intersection of the bit line and the word line. FIG. 13 also shows three source lines SL1, SL2, and SL3. Respective source lines may be connected to each other, so that respective memory cells MC may be connected to a common source line. As described above, a pair of cell composition devices connected to the same bit line and adjacent in the vertical direction form the memory cell MC, and the memory cell MC is connected to corresponding source lines on upper and lower sides of the memory cell MC respectively. The bit lines WL1, WL2, and WL3 are electrically connected to a gate of the cell composition device in the memory cell through corresponding select transistors. The gate of the select transistor is electrically connected to the select line SG1. In addition, an optional bulk connection to each memory cell is schematically shown in FIG. 13 with dotted lines. The bulk connection of each memory cell may be electrically connected to a source line connection of the memory cell.

Here, a two-dimensional array of memory cells MC is shown for illustration convenience only. A plurality of such two-dimensional arrays may be arranged in a direction (for example, a direction perpendicular to the paper surface in FIG. 13) of intersection with this two-dimensional array, so as to obtain a three-dimensional array.

As described above in combination with FIG. 4, each cell composition device includes source/drain regions defined by source/drain layers, and the source/drain regions at upper and lower ends of the each cell composition device are substantially identical in terms of structure. In view of this, source lines SL1, SL2, SL3 and bit lines BL1 and BL2 are interchangeable with each other, and thus may be collectively referred to as cell connecting lines SL/BL. For example, the cell connecting line SL/BL may be separately electrically connected as the source line or the bit line according to a potential applied between each other.

Figure 14:
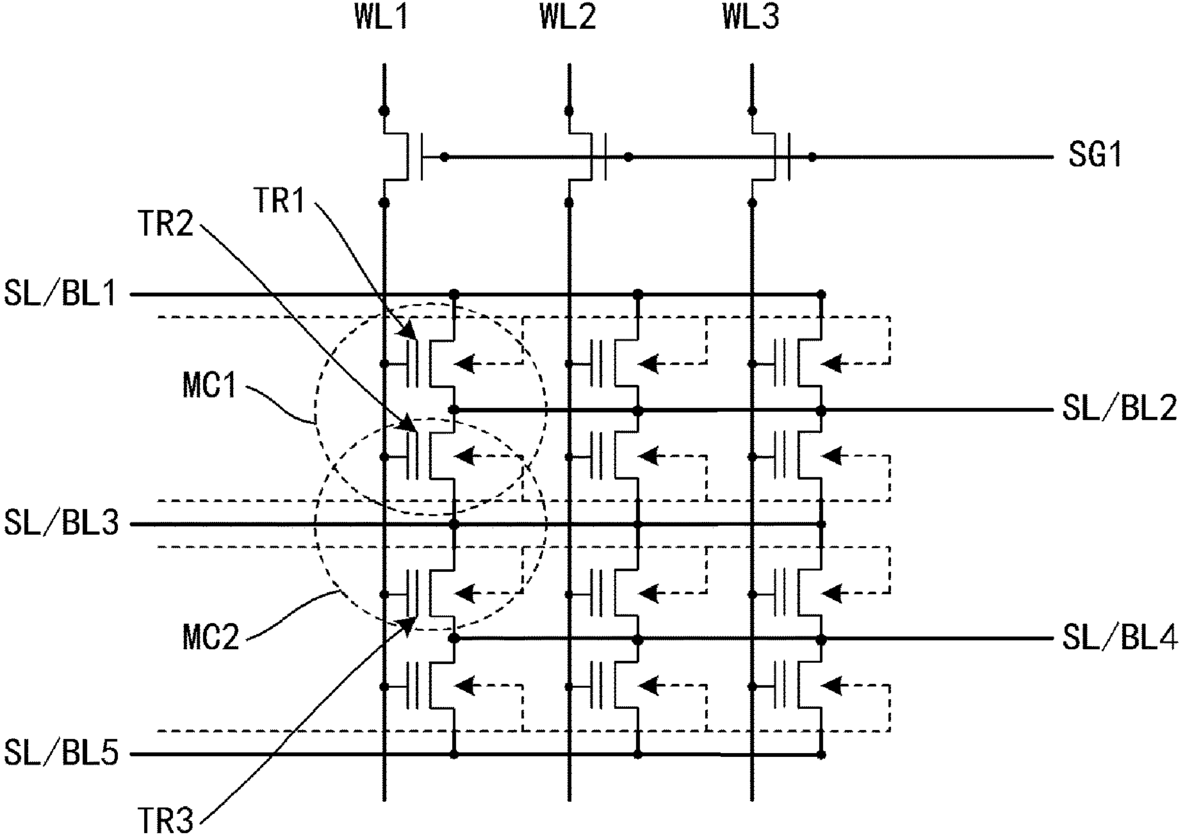
FIG. 14 schematically shows an equivalent circuit diagram of a NOR-type memory device according to another embodiment of the present disclosure, wherein FIGS. 2(*a*), 6(*a*), 11(*a*) and 12 are top views, and FIG. 2(*a*) shows positions of line AA' and line BB'.

FIG. 14 schematically shows an equivalent circuit diagram of a NOR-type memory device according to another embodiment of the present disclosure.

The equivalent circuit diagram shown in FIG. 14 is substantially the same as the equivalent circuit diagram shown in FIG. 13, except that the above-mentioned source lines SL1, SL2, SL3 and bit lines BL1 and BL2 are replaced by cell connecting lines SL/BL1, SL/BL2, SL/BL3, SL/BL4 and SL/BL5. Therefore, the NOR-type memory device shown in FIG. 14 may also be fabricated based on the process described above in combination with FIGS. 1 to 12.

As shown in FIG. 14, the cell connecting lines SL/BL1, SL/BL2, SL/BL3, SL/BL4 and SL/BL5 are respectively electrically connected to source/drain regions of the corresponding cell composition devices. Alternatively, each of the cell composition devices (for example, TR1, TR2 and TR3 schematically shown in FIG. 14) is electrically connected between a respective pair of adjacent cell connecting lines among the cell connecting lines SL/BL1, SL/BL2, SL/BL3, SL/BL4 and SL/BL5. Therefore, for each two adjacent cell connecting lines, one is used as the source line and the other is used as the bit line.

Similar to the above embodiments, a pair of adjacent cell composition devices TR1 and TR2 may define a memory cell MC1.

When the cell connecting lines SL/BL1, SL/BL3 and SL/BL5 are used as the source lines and the cell connecting lines SL/BL2 and SL/BL4 are used as the bit lines as in the above embodiment, the memory cell MC1 may be electrically connected between the cell connecting lines SL/BL1 and SL/BL3 which are used as the source lines, and the cell composition devices TR1 and TR2 in the memory cell MC1 may be commonly electrically connected to the cell connecting line SL/BL2 used as the bit line. Access operations such as read, write, and erase may be performed through the cell connecting line SL/BL2 used as the bit line.

Complementary to the above situation, according to electrical signals applied on the cell connecting lines SL/BL1, SL/BL2, SL/BL3, SL/BL4, and SL/BL5, the cell connecting lines SL/BL1, SL/BL3 and SL/BL5 may be used as bit lines, and the cell connecting lines SL/BL2 and SL/BL4 may be used as source lines. In this case, the memory cell MC1 may be electrically connected between the cell connecting lines SL/BL1 and SL/BL3 which are used as bit lines, and the cell composition devices TR1 and TR2 in the memory cell MC1 may be collectively electrically connected to the cell connecting line SL/BL2 used as the source line. In this case, the access operations such as read, write and erase may be performed simultaneously through the two cell connecting lines SL/BL1 and SL/BL3 which are used as bit lines.

For the memory cell MC1, charges may be trapped not only in source/drain regions of the cell composition device close to the cell connecting line SL/BL2 (that is, a lower end of the cell composition device TR1 and an upper end of the cell composition device TR2), but also in source/drain regions of the cell composition device close to the cell connecting lines SL/BL1 and SL/BL3 (that is, an upper end of the cell composition device TR1 and a lower end of the cell composition device TR2).

In addition, a pair of adjacent cell composition devices TR2 and TR3 may define a memory cell MC2.

Similarly, when the cell connecting lines SL/BL1, SL/BL3 and SL/BL5 are used as the source lines and the cell connecting lines SL/BL2 and SL/BL4 are used as the bit lines as in the above embodiment, the memory cell MC2 may be electrically connected between the cell connecting lines SL/BL2 and SL/BL4 which are used as the bit lines, and the cell composition devices TR2 and TR3 in the memory cell MC2 may be commonly electrically connected to the cell connecting line SL/BL3 used as the source line. The access operations such as read, write, and erase may be performed simultaneously through the two cell connecting lines SL/BL2 and SL/BL4 which are used as bit lines.

On the other hand, when the cell connecting lines SL/BL1, SL/BL3 and SL/BL5 are used as the bit lines and the cell connecting lines SL/BL2 and SL/BL4 are used as the source lines, the memory cell MC2 may be electrically connected between the cell connecting lines SL/BL2 and SL/BL4 which are used as the source lines, and the cell composition devices TR2 and TR3 in the memory cell MC2 may be commonly electrically connected to the cell connecting line SL/BL3 used as the bit line. The access operations such as read, write, and erase may be performed through the cell connecting line SL/BL3 used as the bit line.

For the memory cell MC2, charges may be trapped not only in source/drain regions of the cell composition device close to the cell connecting line SL/BL3 (that is, a lower end of the cell composition device TR2 and an upper end of the cell composition device TR3), but also in source/drain regions of the cell composition device close to the cell connecting lines SL/BL2 and SL/BL4 (that is, an upper end of the cell composition device TR2 and a lower end of the cell composition device TR3).

Therefore, both the source/drain regions at upper and lower ends of each cell composition device may be used to trap charges and thus store data. Compared with the scheme of FIG. 13 with fixed source lines and bit lines, the data storage capacity may be increased.

In the above embodiment, the select transistor is described in combination with the embodiment of a memory cell based on a pair of cell composition devices. However, the present disclosure is not limited thereto. The select transistor and the manufacturing method of the select transistor according to the embodiment of the present disclosure may also be applied to other configurations, such as a NOR-type memory device in which the memory cell is based on a single cell composition device.

The memory device according to the embodiments of the present disclosure may be applied to various electronic apparatuses. For example, the memory device may store various programs, applications and data required for an operation of the electronic apparatus. The electronic apparatus may further include a processor cooperated with the memory device. For example, the processor may operate the electronic apparatus by running a program stored in the memory device. Such electronic apparatus includes, for example, a smart phone, a personal computer (PC), a tablet, an artificial intelligence device, a wearable device, a mobile power supply, an automotive electronic device, a communication device, an Internet of Things (IoT) device, or a headphone (e.g. a true wireless stereo (TWS) headphone), etc.

In the above description, the technical details such as patterning and etching of each layer are not described in detail. However, those skilled in the art should understand that various technical means may be employed to form a layer, a region or the like of having a desired shape. In addition, in order to form the same structure, those skilled in the art may also design a method that is not completely the same as the method described above. In addition, although the respective embodiments are described above separately, this does not mean that the measures in the respective embodiments cannot be advantageously used in combination.

The embodiments of the present disclosure have been described above. However, these examples are for illustrative purposes only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications should fall within the scope of the present disclosure.

What is claimed is:

1. A NOR-type memory device, comprising:

at least one memory cell layer disposed on a substrate, wherein the at least one memory cell layer comprises a first source/drain layer, a first channel layer, a second source/drain layer, a second channel layer, and a third source/drain layer that are sequentially stacked from bottom to top;

at least one gate stack that extends vertically with respect to the substrate to pass through the at least one memory cell layer, wherein the at least one gate stack is surrounded by the at least one memory cell layer, the at least one gate stack comprises a gate conductor layer and a memory functional layer disposed between the gate conductor layer and the at least one memory cell layer, and a memory cell is defined at an intersection of the at least one gate stack and the at least one memory cell layer;

at least one bit line electrically connected to the second source/drain layer in the at least one memory cell layer; and at least one source line electrically connected to the first source/drain layer and the third source/drain layer in the at least one memory cell layer;

wherein a first cell composition device is defined at an intersection of the at least one gate stack with respect to the first source/drain layer, the first channel layer, and the second source/drain layer in the at least one memory cell layer, a second cell composition device is defined at an intersection of the at least one gate stack with respect to the second source/drain layer, the second channel layer, and the third source/drain layer in the at least one memory cell layer, and the first cell composition device and the second cell composition device are connected in parallel to each other to define a corresponding memory cell.

2. A NOR-type memory device, comprising:

at least one memory cell layer disposed on a substrate, wherein the at least one memory cell layer comprises a first source/drain layer, a first channel layer, a second source/drain layer, a second channel layer, and a third source/drain layer that are sequentially stacked from bottom to top;

at least one gate stack that extends vertically with respect to the substrate to pass through the at least one memory cell layer, the at least one gate stack is surrounded by the at least one memory cell layer, wherein the at least one gate stack comprises a gate conductor layer and a memory functional layer disposed between the gate conductor layer and the at least one memory cell layer, and a memory cell is defined at an intersection of the at least one gate stack and the at least one memory cell layer;

at least two bit lines respectively electrically connected to the first source/drain layer and the third source/drain layer in the at least one memory cell layer; and at least one source line electrically connected to the second source/drain layer in the at least one memory cell layer;

wherein a first cell composition device is defined at an intersection of the at least one gate stack with respect to the first source/drain layer, the first channel layer, and the second source/drain layer in the at least one memory cell layer, a second cell composition device is defined at an intersection of the at least one gate stack with respect to the second source/drain layer, the second channel laver, and the third source/drain layer in the at least one memory cell layer, and the first cell composition device and the second cell composition device are connected in parallel to each other to define a corresponding memory cell.

3. The NOR-type memory device according to claim 1, wherein the at least one memory cell layer comprises a plurality of memory cell layers, and wherein the first source/drain layer in each memory cell layer and the third source/drain layer in the memory cell layer below the each memory cell layer are located in the same layer; and/or wherein the third source/drain layer in each memory cell layer and the first source/drain layer in the memory cell layer above the each memory cell layer are located in the same layer.

4. The NOR-type memory device according to claim 3, wherein the first source/drain layer, the first channel layer, the second source/drain layer, the second channel layer, and the third source/drain layer in the at least one memory cell layer are in direct contact with each other, and adjacent memory cell layers are in direct contact with each other.

5. The NOR-type memory device according to claim 1, further comprising:

at least one word line; and at least one select transistor which is disposed on the at least one gate stack respectively and is electrically connected between the at least one word line and the at least one gate stack.

6. The NOR-type memory device according to claim 5, wherein the at least one select transistor comprises an active layer self-aligned with an above portion of the at least one gate stack and a select gate stack surrounding a periphery of the active layer.

7. The NOR-type memory device according to claim 6, wherein the active layer of the at least one select transistor comprises a bottom portion extending at a top portion of the at least one gate stack and a side portion extending from the bottom portion, and an outer wall of the side portion of the active layer is substantially coplanar to an outer wall of the at least one gate stack.

8. The NOR-type memory device according to claim 6, wherein the at least one select transistor comprises a plurality of select transistors, the plurality of select transistors are arranged in a plurality of rows in a first direction, select gate stacks of select transistors in the same row extend continuously with each other in the first direction, and the at least one bit line and the at least one word line extend in a second direction intersecting the first direction.

9. The NOR-type memory device according to claim 1, wherein at least one of the first source/drain layer, the first channel layer, the second source/drain layer, the second channel layer, and the third source/drain layer comprises a single crystal semiconductor material.

10. The NOR-type memory device according to claim 9, wherein the first channel layer and the second channel layer comprise the single crystal semiconductor material.

11. The NOR-type memory device according to claim 1, wherein the memory functional layer comprises at least one of a charge trapping material or a ferroelectric material.

12. The NOR-type memory device according to claim 1, wherein at least one of the first source/drain layer, the first channel layer, the second source/drain layer, the second channel layer, and the third source/drain layer surrounds one or more of the at least one gate stack in a transverse direction.

13. An electronic apparatus comprising the NOR-type memory device according to claim 1.

14. The electronic apparatus according to claim 13, wherein the electronic apparatus comprises a smart phone, a personal computer, a tablet, an artificial intelligence device, a wearable device, a mobile power supply, an automotive electronic device, a communication device, an Internet of Things device, or a headphone.

15. A method of operating the NOR-type memory device according to claim 1, comprising:

in one or more access operations of the NOR-type memory device, electrically connecting the at least one bit line as a bit line, and electrically connecting the at least one source line as a source line; and in further one or more access operations of the NOR-type memory device, electrically connecting the at least one bit line as a source line, and electrically connecting the at least one source line as a bit line.

* * * * *